(12) United States Patent
Bismuto et al.

(10) Patent No.: US 9,209,600 B2
(45) Date of Patent: Dec. 8, 2015

(54) TUNABLE LASER, A METHOD FOR MAKING, AND A METHOD FOR OPERATING SUCH A LASER

(71) Applicant: Alpes Lasers SA, Neuchatel (CH)

(72) Inventors: Alfredo Bismuto, Neuchatel (CH); Johanna Wolf, Zurich (CH); Antoine Mueller, Neuchatel (CH); Jerome Faist, Zurich (CH)

(73) Assignee: Alpes Lasers SA, Neuchatel (CH)

( * ) Notice: Subject to any disclaimer, the term of this patent is extended or adjusted under 35 U.S.C. 154(b) by 0 days.

(21) Appl. No.: 14/480,812

(22) Filed: Sep. 9, 2014

(65) Prior Publication Data

US 2015/0078411 A1 Mar. 19, 2015

(30) Foreign Application Priority Data

Sep. 13, 2013 (EP) ..................................... 13405109

(51) Int. Cl.
*H01S 3/04* (2006.01)
*H01S 5/042* (2006.01)
(Continued)

(52) U.S. Cl.
CPC ........... *H01S 5/0425* (2013.01); *H01S 5/02461* (2013.01); *H01S 5/0612* (2013.01);
(Continued)

(58) Field of Classification Search
CPC ..... H01S 5/0425; H01S 5/183; H01S 5/3401; H01S 5/0612; H01S 5/06837; H01S 5/0261; H01S 5/02453
USPC ............. 372/34, 44.01, 46.01, 45.01, 50.124, 372/50.11, 50.1
See application file for complete search history.

(56) References Cited

U.S. PATENT DOCUMENTS 5,341,391 A 8/1994 Ishimura
5,347,526 A * 9/1994 Suzuki et al. ................... 372/20
(Continued)

FOREIGN PATENT DOCUMENTS

JP H01-173686 A 7/1989
JP H05-315706 A 11/1993
(Continued)

OTHER PUBLICATIONS

Japanese Office Action (English translation) for corresponding Japanese Application No. 2014-176799 mailed Aug. 4, 2015.

*Primary Examiner* — Kinam Park
(74) *Attorney, Agent, or Firm* — Renner, Otto, Boisselle & Sklar, LLP

(57) ABSTRACT

Semiconductor lasers, in particular Quantum Cascade Lasers (QCLs) are tuable especially in the mid-IR spectral range, e.g. in wavelengths of about 3-14 μm, by precisely controlling the laser's temperature in the vicinity of the active region. The present invention introduces a novel design for locally heating the active region, thereby allowing fast heating and thus tuning a laser. It is generally applicable for lasers across the field, e.g. to QCLs with multi-color emitters or to Vertical-Cavity Single-Emitter Lasers (VCSELs) or to Distributed Feedback (DFB) lasers. Essentially, the invention consists of structurally integrating a heating resistor as part of the laser, placed close to the component to be temperature-controlled, i.e. the active region or the grating, etc., and feeding this resistor with a variable electrical current in order to locally control the thermal dissipation. In multi-emitter lasers, a resistor can be associated with each emitter section to tune the temperature of each section and thus its emitted wavelength. Similarly, in multisection DBR lasers, with a resistor associated with each grating, the latter can be tuned and thus the associated wavelength of the optical cavity. The invention also includes a novel manufacturing process, especially for buried heterostructure lasers.

13 Claims, 10 Drawing Sheets

(51) Int. Cl.
*H01S 5/06* (2006.01)
*H01S 5/227* (2006.01)
*H01S 5/183* (2006.01)
*H01S 5/0683* (2006.01)
*H01S 5/026* (2006.01)
*H01S 5/024* (2006.01)
*H01S 5/0625* (2006.01)
*H01S 5/32* (2006.01)
*H01S 5/34* (2006.01)
*H01S 5/40* (2006.01)
*H01S 5/22* (2006.01)

(52) U.S. Cl.
CPC ............. *H01S 5/183* (2013.01); *H01S 5/2275* (2013.01); *H01S 5/3401* (2013.01); *H01S 5/0261* (2013.01); *H01S 5/02453* (2013.01); *H01S 5/06256* (2013.01); *H01S 5/06837* (2013.01); *H01S 5/2224* (2013.01); *H01S 5/3211* (2013.01); *H01S 5/3402* (2013.01); *H01S 5/4087* (2013.01)

(56) References Cited

U.S. PATENT DOCUMENTS

| | | | |
|---|---|---|---|
| 6,546,034 B2 * | 4/2003 | Komori et al. | 372/46.01 |
| 7,944,959 B2 | 5/2011 | Maulini et al. | |
| 8,290,011 B2 * | 10/2012 | Vurgaftman et al. | 372/45.01 |
| 2003/0174751 A1 | 9/2003 | Faist et al. | |
| 2011/0090932 A1 * | 4/2011 | Park et al. | 372/50.11 |
| 2013/0156052 A1 | 6/2013 | Diehl et al. | |

FOREIGN PATENT DOCUMENTS

| | | |
|---|---|---|
| JP | H06-177481 A | 6/1994 |
| JP | 2009-272331 A | 11/2009 |
| JP | 2010-238711 A | 10/2010 |
| WO | WO 02/058197 A2 | 7/2002 |
| WO | WO 2009/075413 A1 | 6/2009 |

* cited by examiner

ALL-01
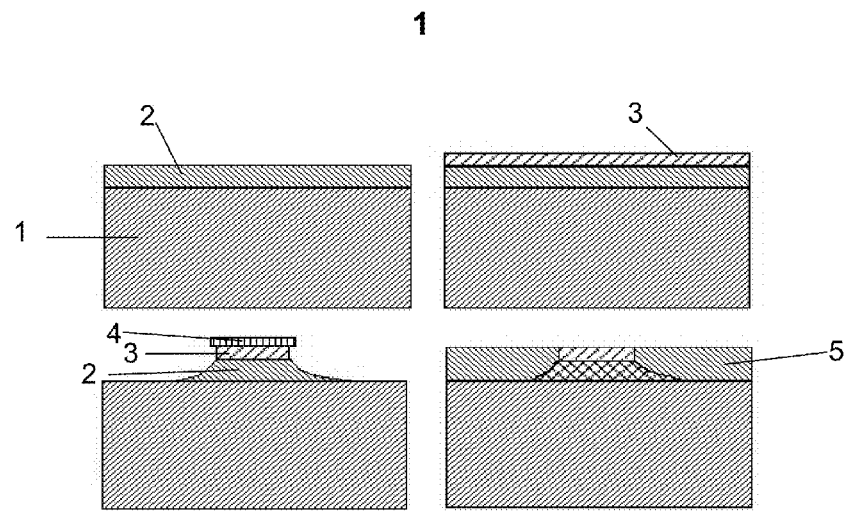
Fig. 1 - Prior Art
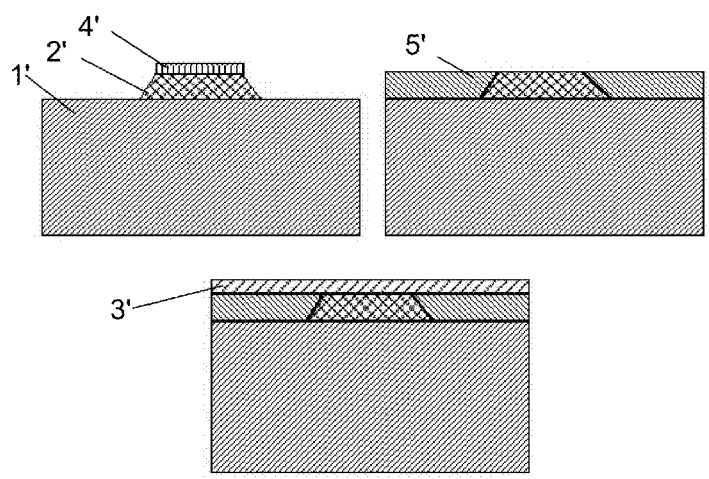
Fig. 2

| Current injected in the heating section | Tuning for a QCL emitting at 2200 cm$^{-1}$ |
|---|---|
| 0.0 A | 0 cm$^{-1}$ |
| 0.1 A | 0.5 cm$^{-1}$ |
| 0.2 A | 2 cm$^{-1}$ |
| 0.3 A | 4 cm$^{-1}$ |
| 0.4 A | 7.5 cm$^{-1}$ |
| 0.5 A | 12 cm$^{-1}$ |

Fig. 19

TUNABLE LASER, A METHOD FOR MAKING, AND A METHOD FOR OPERATING SUCH A LASER

CROSS-REFERENCE TO RELATED APPLICATION

The present application claims priority under 35 USC §119 to European Patent Application No. 13 405 109.3, filed Sep. 13, 2013, the entire disclosure of which is incorporated herein by reference.

TECHNICAL FIELD OF THE INVENTION

The present invention relates to semiconductor lasers, in particular to Quantum Cascade Lasers (QCLs) that are tunable especially in the mid-IR spectral range, i.e. in wavelengths of about 3-14 µm.

DESCRIPTION OF THE RELATED ART

Tuning is effected by precisely controlling the laser's temperature in the vicinity of the active region. The mid-IR spectral range plays an unique role in sensing applications due to the large number of molecules showing fundamental resonances in this region. In the recent decade, Quantum Cascade Lasers (QCLs) have become one of the most frequently used, efficient laser sources in various spectral ranges. Examples are Maulini U.S. Pat. No. 7,944,959 and Faist US patent application 2003/0174751. A QCL laser generating a mid-IR spectrum is also shown in Vurgaftman U.S. Pat. No. 8,290,011.

A typical design is a Distributed Feedback (DFB) laser, here a QCL, with a Bragg grating on top of it, producing a specific emission wavelength, i.e. emitting in a single-mode. By changing the operating temperature of the laser, limited spectral tuning is realized.

However, the availability of multiple spectral lines is still highly desirable for many applications whereby a stable control of the laser wavelength is often necessary. Thus, it is the objective of the present invention to devise such a QCL which generates precisely controllable, multiple spectral lines in the mid-IR range.

However, it should be understood that the present invention is not limited to QCLs of any wavelength, but is generally applicable for lasers across the field, e.g. to QCLs with multi-color emitters or to Vertical-Cavity Single-Emitter Lasers (VCSELs).

SUMMARY OF THE INVENTION

To achieve the above main objective, the present invention introduces a novel and advantageous technique for tuning a laser, especially a QCL operating in a mid-IR spectral range.

First, to allow fast modulation of the laser's emission wavelength(s) through thermal tuning, a novel method of local heating is disclosed.

A buried heterostructure is preferable for implementing a particular design of the novel tunable laser according to the invention. For this implementation, a novel manufacturing process for such a laser is presented.

Further, as indicated above, to obtain multiple single, but tunable spectral modes, multiple emitters may be placed in the same optical waveguide or on separate waveguides, using the novel method of local heating. Here again, the novel manufacturing process, mentioned above, may be implemented when using a buried heterostructure design. Thus, tunable wavelength-independent, single beam emissions are guaranteed. By introducing an additional etching step, each emitter can be addressed singularly.

Also, a novel technique to obtain widely tunable QCLs using Distributed Bragg Reflectors (DBRs) is disclosed. The reflectivity of each mirror (DBR1, DBR2, explained further below) presents a comb shape with mode spacing of $\Delta\lambda 1$ and $\Delta\lambda 2$. Lasing will therefore occur for the modes where both mirrors present high reflectivity. An integrated resistor allows to tune thermally the reflectivity of each mirror, thus a quasi-continuous laser tuning can be obtained using the Vernier effect over wide ranges. As in the case of the multi-color emitters, mentioned above, a resistor associated with one or several emitter sections can be used to tune the temperature of the section and thus its optical properties. Similarly, in multi-color lasers with several emitters, a resistor associated with each DFB can be used to tune the latter and thus the associated wavelength.

BRIEF DESCRIPTION OF THE DRAWINGS

In the appended drawings show:

FIG. 1 a prior art Buried Heterostructure (BH) fabrication process,

FIG. 2 the BH fabrication process according to the invention,

FIG. 19 a table showing exemplarily the wavelength variation/tuning as function of the injected "heating" current.

DETAILED DESCRIPTION OF THE INVENTION

The Integrated Resistor

Figure 3:
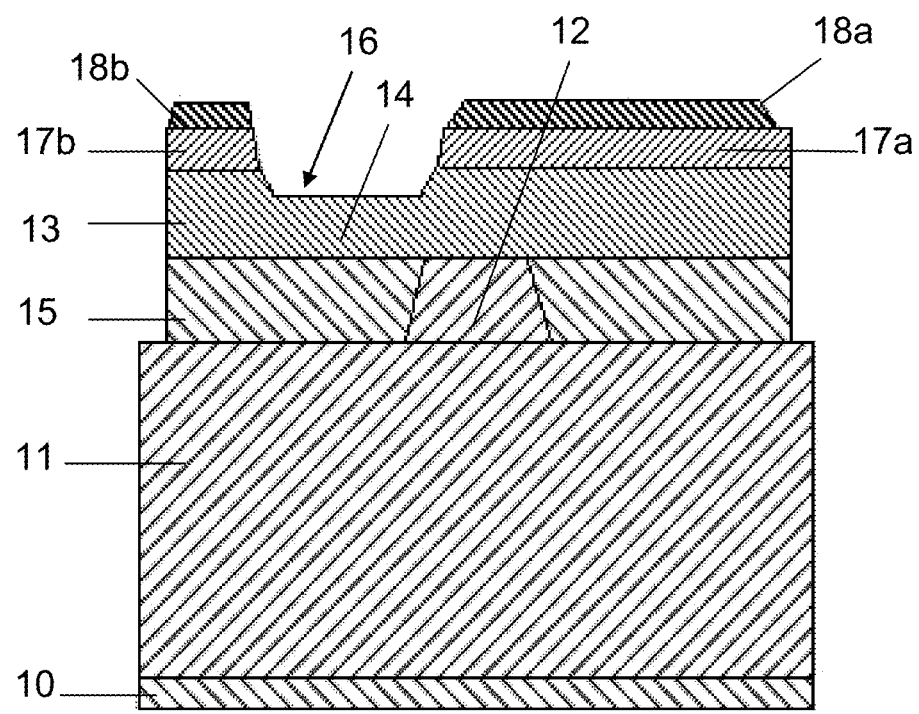
FIG. 3 an edge-emitting laser with a single integrated resistor according to the invention, FIG. 4 a top view of the laser shown in FIG. 3, FIG. 5 an edge-emitting laser with two integrated resistors, FIG. 6 a top view of the laser shown in FIG. 5, FIG. 7 a laser with two asymmetrically arranged integrated resistors, FIG. 8 a top view of the laser shown in FIG. 7, FIG. 9 an edge-emitting multi-emitter laser according to the invention, FIG. 10 a top view of the laser shown in FIG. 9, FIG. 11 multi-section laser including one or multiple heating electrods, FIG. 12 a top view of the laser shown in FIG. 11, The following figures are graphs of FIG. 13 resistance vs. resistor channel thickness, FIG. 14 dissipated power density vs. resistor channel thickness, FIG. 15 active region average temperature increase vs. resistor channel thickness, FIGS. 16, 17 2-D temperature patterns for two resistive channel thicknesses, FIG. 18 time dependent active region temperature increase.

A frequently used technique for emission-tuning of a semiconductor laser is temperature tuning. This is usually done by controlling or modifying the temperature of the laser submount, resulting in a change of the temperature of the active medium or region which in turn affects the laser's emission spectrum.

This technique has some intrinsic limitations or disadvantages. The first disadvantage is the long time constant, i.e. the time necessary to modify the temperature of the active medium in consequence to the temperature of the laser submount. Hence the maximum tuning speed available is limited to the Hz range, which is too slow for many applications.

Secondly, for fabricating single spectral mode lasers, generally narrow active regions are necessary to guarantee single mode emission. As a consequence, due to the elevated thermal conductance of narrow ridge lasers, the tuning amplitude is limited.

The present invention introduces a way to locally increase the active region temperature independently of the laser submount or housing temperature by introducing a dissipative or heating region near the laser's active region, thus allowing a fast and efficient modulation of the active region medium temperature.

To obtain this result for a Buried Heterostructure (BH) laser, a modified version of the fabrication process was implemented, described subsequently. Please note that the following description just defines the principle of the modified manufacturing process—it does not go into the details. These are known to the person skilled in the art.

FIG. 1 shows the prior art BH fabrication process. On top of a semiconductor substrate 1, e.g. n-doped InP, an active region 2 is built, onto which an n-doped cladding 3 is deposited which later provides electrical injection into the active region 2 and, simultaneously, confines the optical mode inside the active region. The laser ridge is covered by a mask 4, then etched and, through selective regrowth of insulating semiconductor material 5, e.g. InP:Fe, electric insulation is provided. Subsequent manufacturing steps are omitted here.

FIG. 2 presents the novel and inventive variation of this manufacturing process according to one aspect of the present invention. After growing the active region 2', a mask 4' is applied and the laser ridge, i.e. the active region, is immediately etched. Then the insulating semiconductor layer 5', e.g. InP:Fe, is grown. After that, the n-doped cladding 3' is deposited on the whole device in a planar regrowth. Again, subsequent manufacturing steps are omitted here.

The important difference to the prior art structure of FIG. 1 is that the epitaxial regrowth sequence is inverted and that the cladding 3' now overlays the whole structure, i.e. extends also over the insulating layer 5'.

This results in some important advantages. First, it provides a wide contact region where a dissipative "heater region" according to the invention can be inserted. Also, the reduced thickness of the selective regrowth results in an increased quality of the layers and a reduced defect density.

Using the above process, a way of generating a dissipative section is the insertion of a resistive channel inside the cladding 3', which channel allows a controlled heating of the active region.

However, the present invention is not limited to the described fabrication method, but covers any case in which an additional electrode and/or a specific resistor is added to the semiconductor laser functioning to independently modify the local active region temperature.

Please note that, in the subsequent description and the associated drawings, not all components are shown which are necessary for the operation of the lasers (e.g. the obligatory mirrors, any antireflection coatings, etc.) The person skilled in the art will know where to place and how to design the omitted parts and components. For the sake of clarity, the following descriptions focus on those parts and components that distinguish the present invention over the prior art.

A First Embodiment

In principle, the waveguide cladding layer of a QCL laser is generally a highly n+doped region into which electrons are injected directly from a superposed metal contact. The doping of the cladding layer is usually decreased close to the active region in order to lower the optical losses of the laser's n-doped region. By etching an appropriate trench into the cladding layer, two different, independent contacts can be generated. The electric resistance between these two contacts depends on the doping, the thickness, and the width/length of the linking region of the cladding.

FIG. 3 shows an implementation of this concept in detail. An active region 12 on a substrate 11, usually n-doped InP, is enclosed by insulating layers 15, preferably of InP:Fe. Extending over the active region 12 and the insulating layers 15 is a cladding layer 13, preferably consisting of lowly doped InP. Shown on top of the cladding layer 13 are two separate, highly doped contact areas 17a and 17b, preferably of n++doped InP, divided by a trench 16. Each of these contact areas 17a and 17b is covered by a metallic, usually Au, electrode 18a and 18b, resp. It should be noted that the contact areas 17a and 17b are not necessary for the functioning of the invention so that they may be omitted. In this case, the electrodes 18a and 18b would be placed directly on the two islands of the cladding 13, separated by the trench 16. A counter electrode or cathode 10 is placed on the bottom of the substrate 11.

The current injected into the active region 12 through the electrode 18b, the "heating" or "secondary" electrode, is partially dissipated in the lowly doped section of the waveguide cladding 13, while the current from the electrode 18a, the "primary" electrode, is practically directly injected into the active region 12. Because of the intrinsic resistance of the cladding layer 13, the current injected by the secondary electrode 18b generates heat in the current path 14, which in turn warms up the active region 12 and, to some extent, also the insulating layer 15. This heating modifies the optical properties of the laser's cavity and consequently the emission wavelength.

By modifying the current injected into the electrode 18b, and/or by modifying the ratio between the currents injected through the two electrodes 18a and 18b, resp., or by adapting the voltages applied to the two electrodes 18a and 18b, resp., the current through the path 14 is altered and thus the temperature of the active region 12. This in turn controls the laser's emission spectrum. An example of this functioning method is provided in the table depicted in FIG. 19, showing exemplary values for the variation or tuning of the emitted wavelength as function of the injected "heating" current.

The inherent resistance of the current path 14, i.e. the "heating section", can be adapted during the fabrication process. For example, increasing the etching depth of the trench 16, or placing the trench 16 further away from the active region 12, and/or increasing the width of the trench 16, or reducing the doping level of the cladding 13 increases the resistance of this current path 14, i.e. the "heating section" and vice versa.

Figure 4:
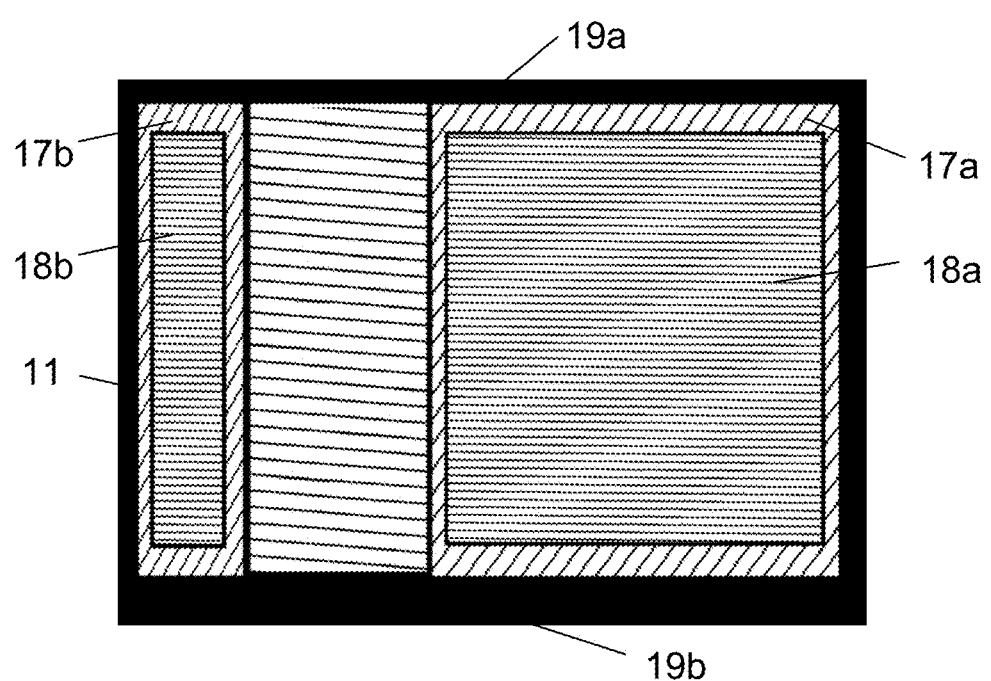

FIG. 4 shows a top view of the first embodiment. To avoid overheating and thus damaging the active region 12 in the vicinity of the facets 19a and 19b, i.e. to avoid so-called COD, it may be preferable to keep the secondary electrode 18b shorter than the length of the associated active region 12; this is not shown in FIG. 4 however. If there is a contact area 17b—which, as explained above, is not necessarily so—this is preferably shorter, too. The same goal can also be achieved by modifying the form of the trench 16 and/or modifying the doping of the cladding 13.

A Second Embodiment

Figure 5:
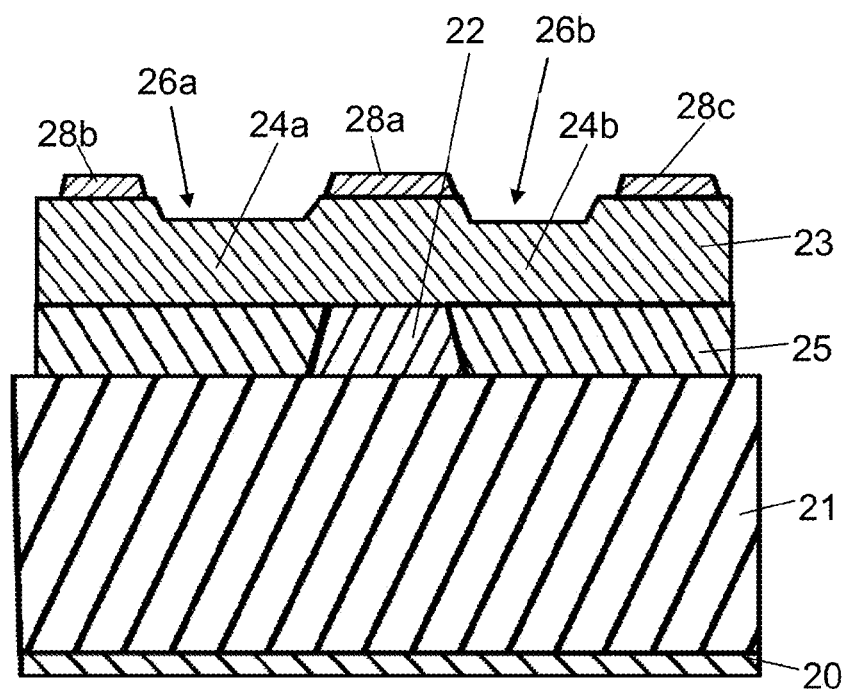

FIG. 5 displays a second embodiment. The main difference with regard to the first embodiment is that two "heating" or "secondary" electrodes 28b and 28c and the associated structures are provided on both sides of the active region 22 in a practically symmetric design. There are two trenches 26a and 26b and resistive paths 24a and 24b, both of nearly identical shape. The substrate 21 with its rear contact 20, the insulating layer 25, and the cladding 23 have the same function as described above in connection with FIGS. 3 and 4. Note that there are no contact areas as shown in FIGS. 3 and 4. The function of this structure is as described above with the difference that there are two heating regions. This allows for a more uniform heating of the active region 22, a further advantage. Further, the two distinct heating sections that can be separately controlled, allowing for any variety of desired heating of the so constructed laser.

Figure 6:
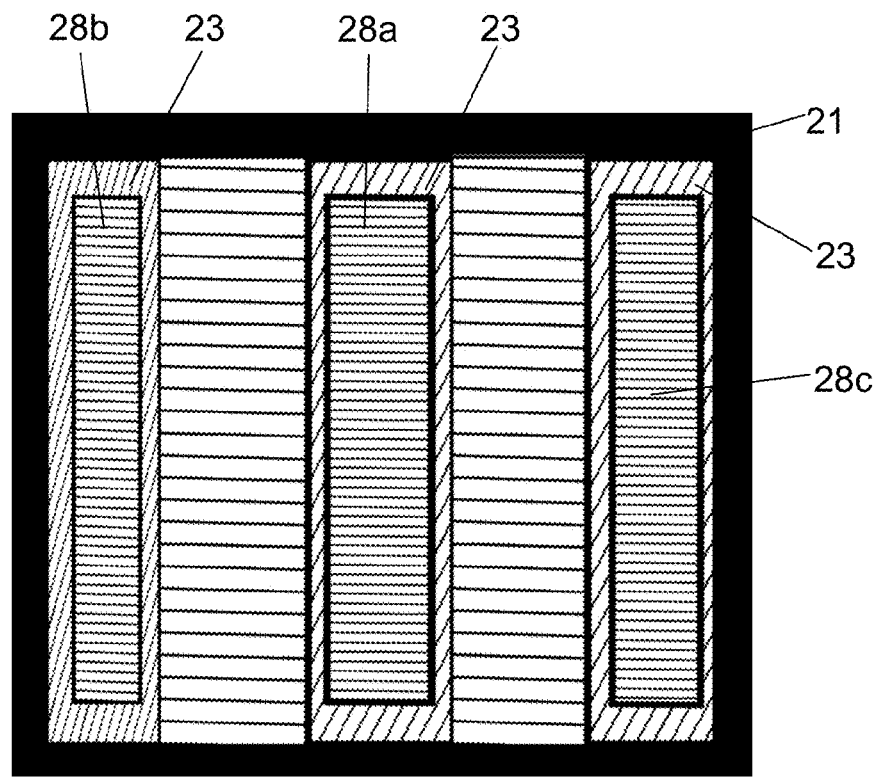

FIG. 6 presents a top view of FIG. 5, showing the arrangement of the second embodiment with the two symmetrically arranged heating electrodes 28b and 28c, the primary electrode 28a in the middle, and the two trenches 26a and 26b forming the two practically symmetrical resistive paths. The whole structure can be constructed identical or slightly different.

A Third Embodiment

Figure 7:
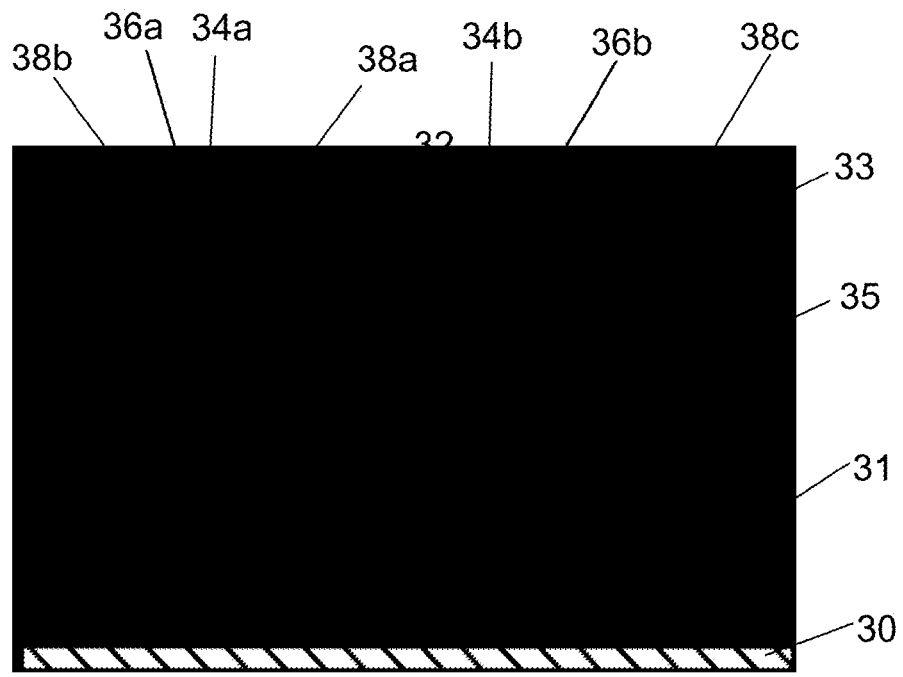
Figure 8:
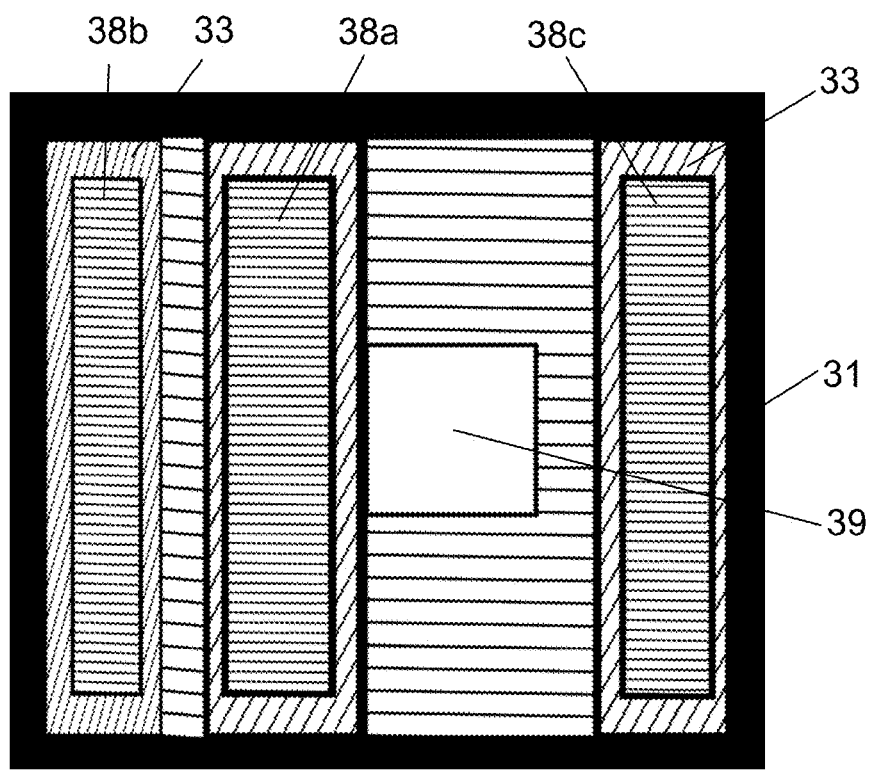

FIGS. 7 and 8 show a third embodiment. Here again, several "heating" or "secondary" electrodes are provided around an active region, but the whole is of significantly different, asymmetric design. First, the primary electrode 38a is not centered on the active region 32, but displaced in relation to it. This e.g. allows to design an emission window, providing a vertical exit window of a so-called vertical-cavity laser.

One of the "heating" or "secondary" electrodes, namely 38b and the associated structure is much closer to the primary electrode 38a than the other secondary electrode 38c. Consequently, the trench 36a between the primary electrode 38a and the secondary electrode 38b is narrower than the trench 36b between the primary electrode 38a and the secondary electrode 38c. Also, the two trenches 36a and 36b are shown with different depths to indicate the possible variations of the design. Further, the two distinct and different heating sections can be controlled separately, allowing for any desired heating of the so constructed laser.

The substrate 31 with its rear contact 30, the insulating layer 35, and the cladding 33 have the same function as described above in connection with FIGS. 3 and 4. However, note again that there are no contact areas as shown in FIGS. 3 and 4. As mentioned, the advantage of the structure shown in FIGS. 7 and 8 is that it allocates space for an emission window of a vertical-cavity surface-emitting laser (VCSEL), providing the advantages of the present invention for this type of lasers, e.g. allowing to fine-tune it.

FIG. 8 presents a top view of FIG. 7, showing the arrangement of the third embodiment with the asymmetrically arranged secondary or heating electrodes 38b and 38c. The other components displayed correspond to the parts depicted in FIG. 7. Usually, this design would be an edge-emitting laser of the same kind as described hereinbefore. However, if desired and as mentioned above, the laser shown in FIGS. 7 and 8 may be designed as vertical-cavity surface-emitting laser (VCSEL), mentioned above, and thus incorporate a (vertical) exit window 39, shown here as example.

A Multi-emitter Embodiment

Figure 9:
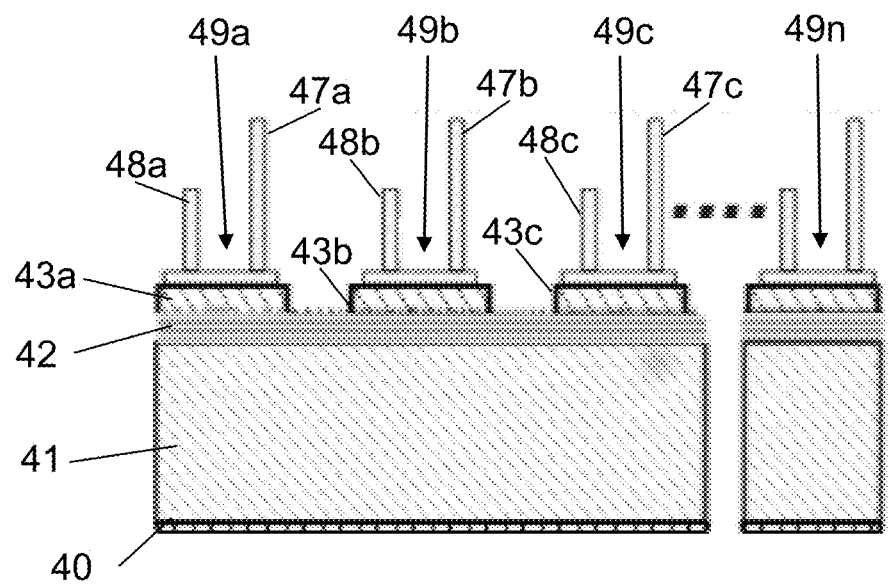

FIG. 9 displays a multi-color/wavelength, edge-emitting laser structure implementing the invention. In this design, several lasers 49a ... 49c emitting different wavelengths through the same active region 42 are placed on a common substrate 41. Each single laser 49a ... 49c features a primary electrode, each indicated here by its primary connection 47a ... 47c, and at least one secondary or heating electrode, each here indicated by its secondary connection 48a ... 48c.

An additional laser 49n is shown at the right end, indicating that the number of lasers on the substrate 41 is not limited to three. A counter electrode or cathode 40 is placed on the bottom of the substrate 41.

Figure 10:
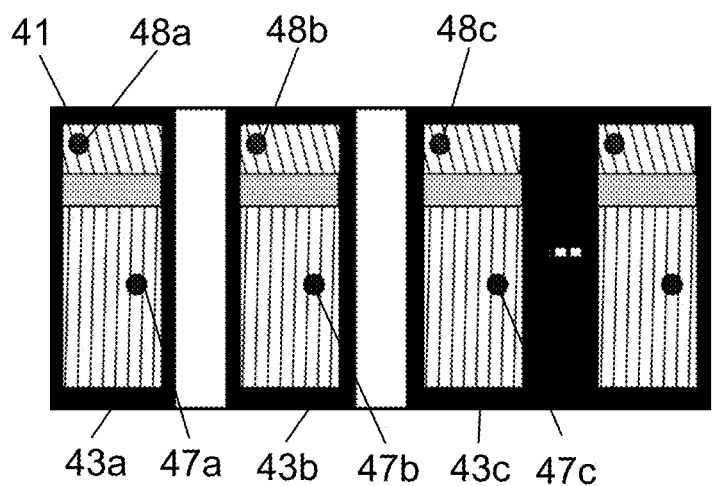

The insulation layer and the cladding 43a ... 43c of each single laser 49a ... 49c are only adumbrated in FIGS. 9 and 10 since their positions and functions should be clear from the foregoing description.

Each of the lasers can be controlled separately, allowing to fine-tune the laser structure's output one by one. One possibility is to affect the active region's temperature of each laser and thus the laser's wavelength through the described, implemented heating system.

If the described multi-color/wavelength laser is of the DFB type, the temperature control affects the grating on each laser and thus the laser's wavelength through the described heating system.

FIG. 10 presents a top view of the design depicted in FIG. 9, showing the arrangement of the multi-color, multi-emitter laser structure implementing the invention. The depicted embodiment shows, on each single laser, the primary electrode with its connection 47a ... 47c, the insulation layer/cladding 43a ... 43c underlying that electrode, the single secondary or heating electrode with its respective connection 48a ... 48c, and the common substrate 41.

Multisection Laser Laser

Figure 11:
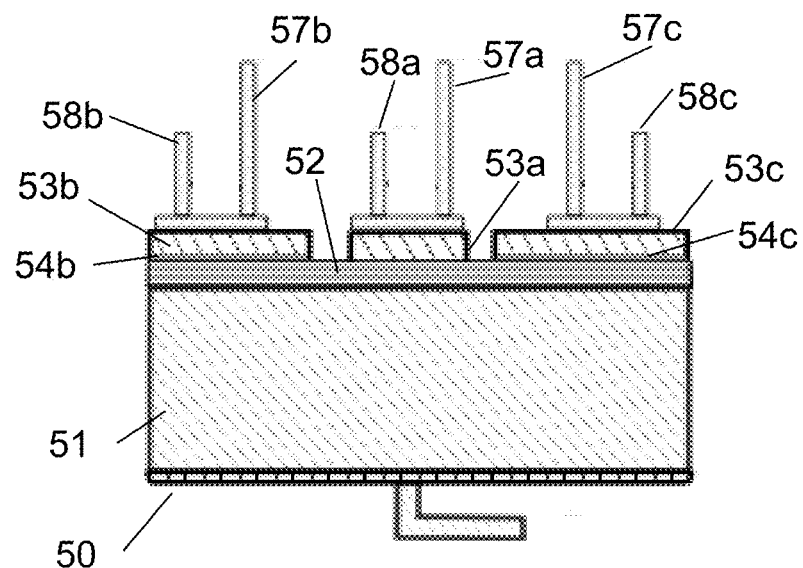

FIG. 11 shows a multisection, edge-emitting laser with distributed Bragg reflectors. The Bragg gratings serving as distributed feedback reflectors (DBR sections) 54b and 54c are embedded in the structure, e.g. on the top of the active region 52. A counter electrode or cathode 50 is placed on the bottom of the substrate 51.

Looking somewhat similar to the previously described multi-emitter laser, there are several arrangements of primary and secondary electrodes/connections on top of this DFB laser. However, there is a significant difference: the laser is in this case constituted by multiple sections, e.g. front mirror, back mirror, phase section, and the temperature and the drive current in each of these sections is used to tune the emission wavelength of the laser.

In detail: whereas the primary electrode and its associated connector 57a and the secondary electrode/connection 58a control the temperature of the active region 52 and thus its optical properties, the electrode/connection pairs 57b/58b and 57c/58c control the temperature of the DBR gratings 54b and 54c, resp., i.e. the mirror properties. Thus, tuning of the laser is available through altering/controlling both the temperature of the active region 52 and the temperature of the DBR gratings 54b and 54c.

Figure 12:
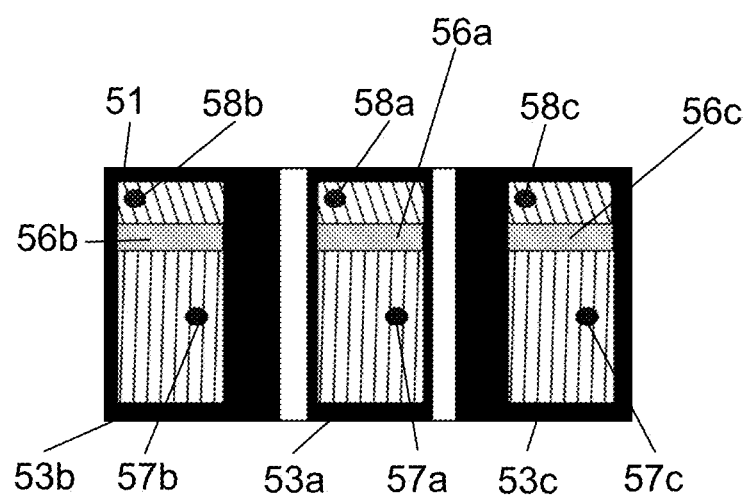

FIG. 12 is a top view of the design depicted in FIG. 11, showing the arrangement of the edge-emitting DBR laser. The primary electrode/connection 57a and the secondary or heating electrode/connection 58a are located in the center of the laser and control the active region. The two pairs of primary and secondary electrodes/connections 57b/58b and 57c/58c are located towards both ends of the active region; they control the grating serving as front and back mirrors.

Also shown in FIG. 12 are the insulation layers/claddings 53a ... 53c underlying the various electrodes, the various electrodes with their respective connections 57a ... 57c and 58a ... 58c, and the common substrate 51.

Generally speaking, the present invention has a further advantage also when applied to standard distributed feedback (DFB) lasers. Since such a laser usually includes a grating, the heating provided by the additional "heating" electrode may be used to quickly fine-tune the optical mode phase, i.e to adjust the phase of the longitudinal optical mode in accordance with the cavity mode, thus improving the single-mode yield and reducing the risk of mode-hopping.

In the following, the FIGS. 13 to 18 will be discussed; these figures show diagrams or graphs of various functions and dependancies.

The measurements were made on an edge-emitting QCL laser with a ridge 7.5 µm wide and a dissipative region 5 µm wide. The dissipative region is doped $10^{16}$ cm$^{-3}$. In this structure, the thickness of the resistive channel was varied and the stationary temperature observed.

Figure 13:
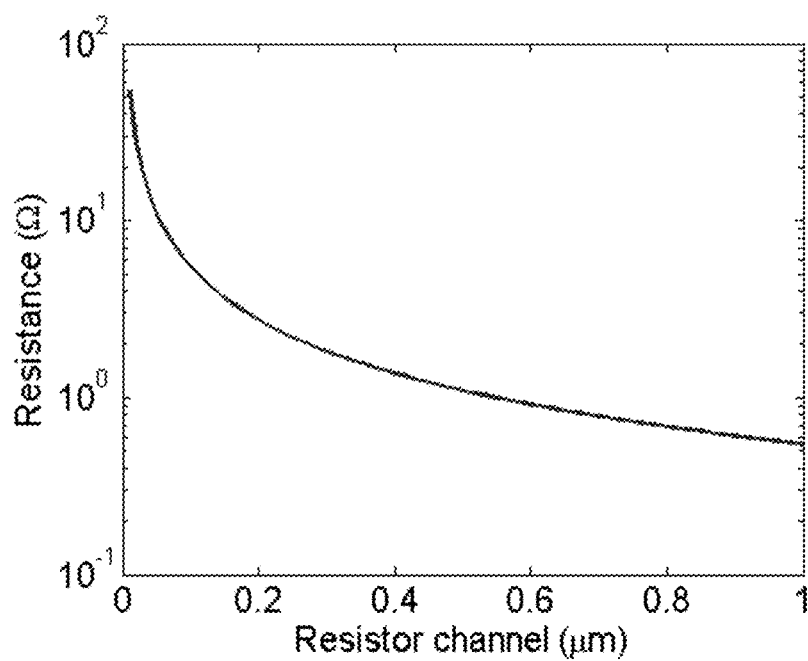

In FIG. 13, the resistance of the dissipative or heating region is plotted as function of the thickness of the resistor channel, calculated using the Drude model.

Figure 14:
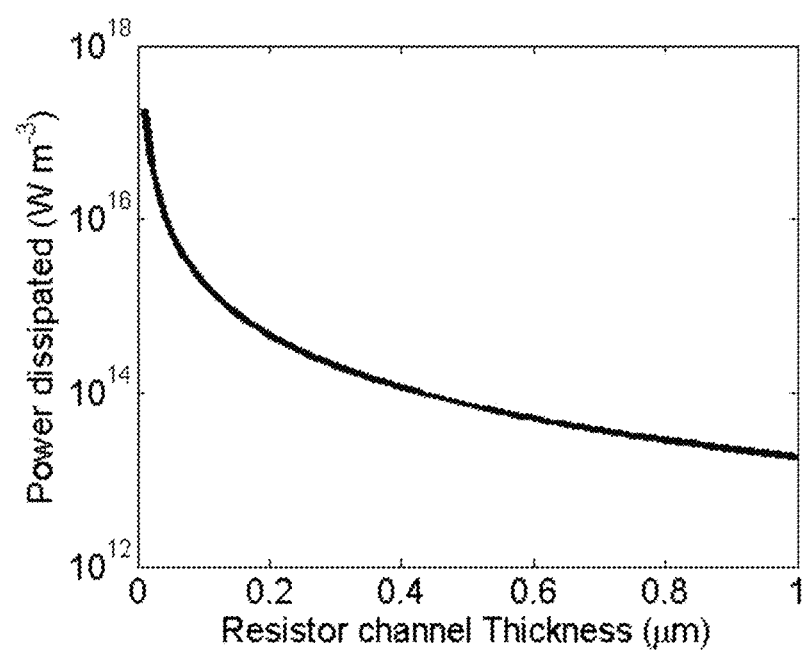

FIG. 14 shows the calculated dissipated power for an injected current of 1A as function of the resistor channel thickness which in turn is a function of the etching depth.

Figure 15:
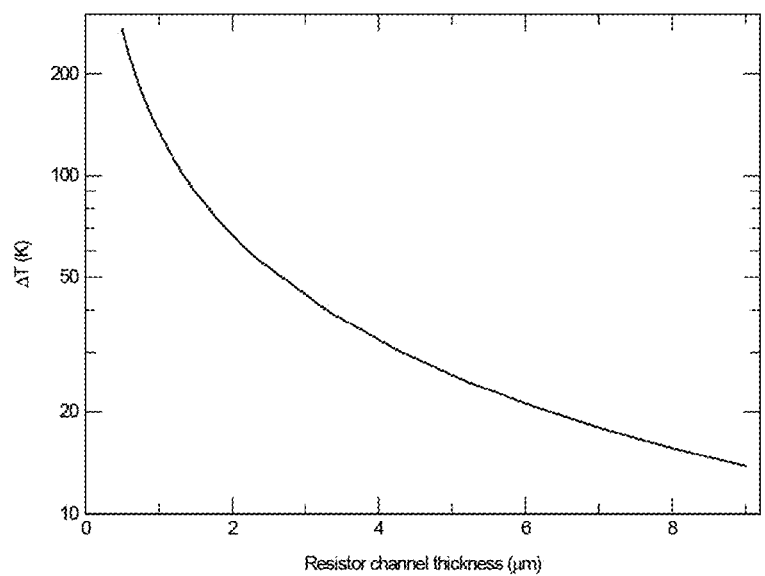

FIG. 15 displays the stationary increase of the temperature as function of the resistor channel thickness. As shown, a temperature increase as high as 200K can be observed if the thickness of the resistive channel is changed from 500 nm to 2 µm.

Figure 16:
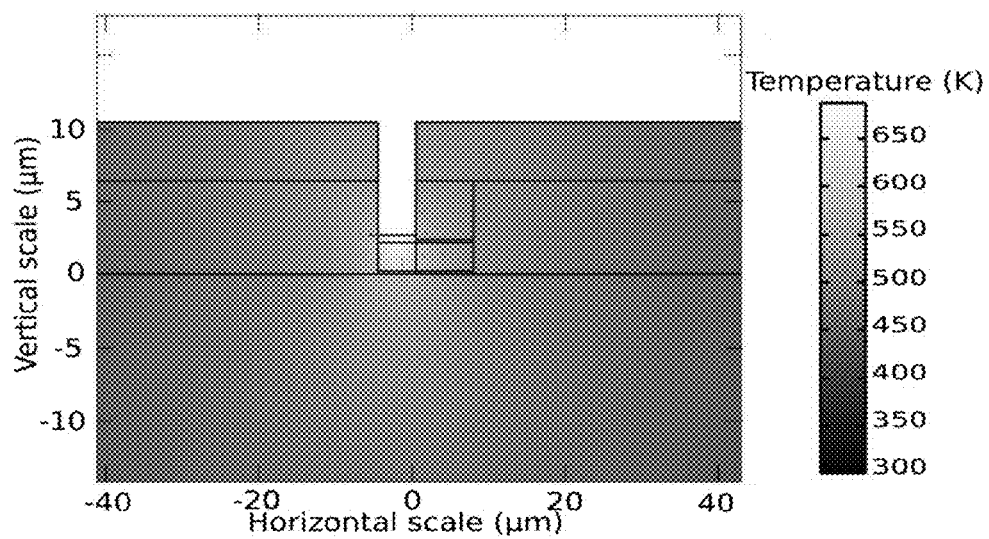
Figure 17:
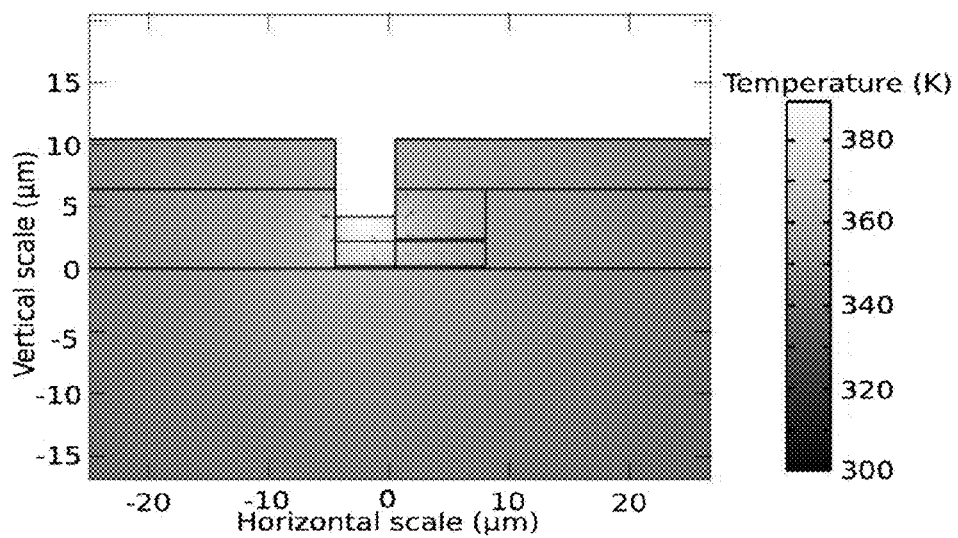

FIGS. 16 and 17 compare the temperature patterns for two resistive channel thicknesses of 500 nm (FIGS. 14) and 2 µm (FIG. 15) in the case of an injection current of 1A inside the resistive paths.

As mentioned above, one of the main advantages of the present invention is the possibility to obtain a high modulation speed of the active region temperature and therefore of the emission wavelength.

Figure 18:
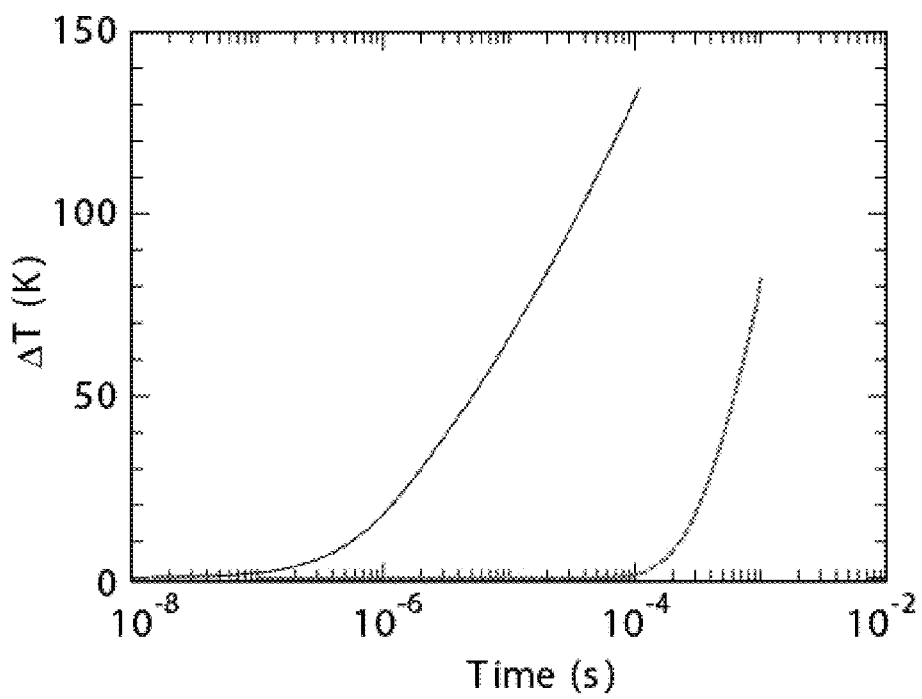

FIG. 18 depicts this advantage. The temperature transient for a resistive channel of 500 nm depth is analyzed—left curve—and compared to the temperature transient—right curve—in the case of an instantaneous submount temperature change.

The right curve shows time constant (or sluggishness) of temperature changes for a prior art submount heating design. The left curve shows the time constant for a system according to the present invention. In this latter case, the temperature can be increased of up to 20K in 1 µs, while in the case of a change of the submount temperature, the same increase can only be obtained in 300 µs or more, even supposing an instantaneous temperature change of the laser's back contact. Thus, in a "heating contact design" according to the present invention, the temperature can be modulated in the MHz range, guaranteeing a wide tuning of the laser emission not obtainable with standard prior art designs.

Finally, the table shown in FIG. 19 presents the emission tuning for a resistive path, 500 nm thick, as function of the current dissipated in the resistive path for a laser emitting at 2200 cm$^{-1}$.

The above detailed description of the function and of various embodiments of the present invention permit a person skilled in the art to devise further implementations without departing from spirit and scope of the present invention.

Although the invention has been shown and described with respect to certain preferred embodiments, it is obvious that equivalents and modifications will occur to others skilled in the art upon the reading and understanding of the specification. The present invention includes all such equivalents and modifications, and is limited only by the scope of the following claims.

The invention claimed is:

1. A wavelength-tunable Quantum Cascade Laser (QCL), in particular a QCL radiating in the mid-IR spectral range with a substrate, an active region, a cladding, an insulating layer, and, on or above said cladding, a primary electrode providing for the current injection into said active region, comprising
    a secondary or further electrode separate from said primary electrode for injecting a secondary current into said laser,
    a resistive path connected to said secondary or further electrode, said resistive path being located to affect the temperature of said active region.

2. The laser according to claim 1, wherein
    the resistive path extends between the secondary electrode and the active region and/or the primary electrode.

3. The laser according to claim 1, wherein
    the resistive path is located in the cladding of the laser and consists or comprises a section with a predetermined resistance.

4. The laser according to claim 3, further including
    a primary contact area between the primary electrode and the cladding and
    a secondary or further contact area between the secondary electrode and the cladding.

5. The laser according to claim 1, further including
    two or more secondary electrodes and
    two or more resistive paths, preferably in said cladding, associated with each of said secondary electrodes.

6. The laser according to claim 1, wherein
    the two or more secondary electrodes and their associated resistive paths, are positioned approximately symmetrical to the primary contact area.

7. The laser according to claim 1, wherein
    at least one of the secondary electrodes is shorter than the primary electrode.

8. The laser according to claim 1, further including
    Bragg reflectors, in particular Distributed Bragg Reflectors (DBRs) encompassing the active region.

9. A multi-emitter laser, comprising
    a plurality of lasers according to claim 1.

10. A method for manufacturing a laser according to claim 1, comprising the following steps
    growing an active region on a semiconductor substrate,
    applying a mask onto said active region and etching a ridge,
    growing an insulating semiconductor layer,
    depositing a cladding layer,
    etching a trench into said cladding layer with a predetermined depth, thus producing at least two separate cladding layer islands, and
    covering each of said cladding layer islands with an electrode.

11. The manufacturing method for a laser according to claim 10, wherein
    the semiconductor substrate is an InP n-doped substrate,
    the insulating semiconductor layer is InP:Fe,
    the cladding is n-doped, and
    the electrodes are metallic, preferably Au electrodes.

12. A method for operating a laser according to claim 1, wherein
    a primary injection current is delivered by the primary electrode, and
    a secondary injection current is delivered by at least one of the secondary electrodes,
    said secondary injection current being regulated to effect a controlled heating of an associated resistive path which heating in turn tunes the laser's frequency.

13. The operating method according to claim 12, wherein the ratio of primary injection current to secondary injection current is chosen to both provide a desired laser power output and a tuned frequency and/or to adjust the phase of the optical mode.

* * * * *